United States Patent
Dalal et al.

[11] Patent Number: 5,922,496
[45] Date of Patent: Jul. 13, 1999

[54] SELECTIVE DEPOSITION MASK AND METHOD FOR MAKING THE SAME

[75] Inventors: Hormazdyar Minocher Dalal, Milton; Gene Joseph Gaudenzi, North Salem, both of N.Y.; Frederic Robert Pierre, Nennecy; Georges Henri Robert, Baulne, both of France

[73] Assignee: International Business Machines Corporation, Armonk, N.Y.

[21] Appl. No.: 08/972,183

[22] Filed: Nov. 18, 1997

[51] Int. Cl.$^6$ .................................................. G03F 9/00
[52] U.S. Cl. ............................ 430/5; 430/308; 101/127
[58] Field of Search ....................... 430/5, 308; 101/127, 101/129

[56] References Cited

U.S. PATENT DOCUMENTS 5,359,928  11/1994  Blessington et al. ............... 101/128.4
5,593,080  1/1997  Tashima et al. ......................... 228/39
5,634,268  6/1997  Dalal et al. ............................. 29/840

Primary Examiner—S. Rosasco
Attorney, Agent, or Firm—Daryl K. Neff, Esq.

[57] ABSTRACT

A material deposition contact mask is disclosed in which apertures formed therein have a larger dimension in lower openings in a bottom side of the mask contacting the substrate than in constricted openings located near the top side of the mask. Apertures of the contact mask have knife edges located within the upper sidewalls thereof, e.g. within the top 25% of the mask thickness above the substrate. A mask is disclosed which, in addition, is thermally compensated to the substrate temperature at which the deposition is performed. Methods for fabricating the mask by differential etching are disclosed.

14 Claims, 3 Drawing Sheets

SELECTIVE DEPOSITION MASK AND METHOD FOR MAKING THE SAME

CROSS-REFERENCE TO RELATED PATENTS AND PATENT APPLICATIONS

This patent application is related to the following U.S. patent and pending U.S. patent applications, all of which are assigned to the Assignee of the instant application and the disclosures of which are hereby incorporated by reference: U.S. Pat. No. 5,634,268 to Dalal et al. entitled "Method for Making Direct Chip Attach Circuit Card"; Serial No. To Be Determined filed on even date herewith entitled "Method for Forming Features upon a Substrate" (Attorney Docket No. FI9-97-054); Ser. No. 08/476,474 filed Jun. 7, 1995, entitled "Reflowed Solder Ball with Low Melting Point Metal Cap" (Attorney Docket No. FI9-95-068); Ser. No. 08/474,475 filed Jun. 7, 1995, entitled "Method for Forming Reflowed Solder Ball with Low Melting Point Metal Cap" (Attorney Docket No. FI9-95-044); Ser. No. 08/476,472 filed Jun. 7, 1995, entitled "Direct Chip Attach Circuit Card" (Attorney Docket No. FI9-95-087); Ser. No. 08/740,571 filed Oct. 31, 1996, entitled "Flip Chip Attach on Flexible Circuit Carrier Using Chip with Metallic Cap on Solder" (Attorney Docket No. FI9-95-164); and Ser. No. 08/846,930 filed Apr. 30, 1997, entitled "Capacitor with Multi-Level Interconnection Technology" (Attorney Docket No. FI9-97-066).

FIELD OF THE INVENTION

The present invention relates to selective deposition masks, and more specifically to selective deposition masks utilized in the fabrication of integrated circuits and wiring.

BACKGROUND OF THE INVENTION

Existing contact masks used for the selective deposition of metal pads in back-end-of-line (BEOL) integrated circuit manufacturing are approaching the limit of their ability to define smaller features to increase the density of integrated circuit (IC) chip arrays such as memory or logic arrays. In moving to increased integration density, solder deposition and chip attach processes have had to be conducted at lower temperatures than before, in order to reduce the effects of differential thermal expansion between the chip substrate and the mask or chip carrier during processing. In order to permit chip attach processes at lower temperatures, two step deposition processes have been disclosed in the above-referenced U.S. patent application Ser. Nos. 08/476,474 and 08/740,571 (Attorney Docket Nos. FI9-95-068 and FI9-95-164, respectively), in which a low melting point (LMP) capping composition (e.g. tin or a eutectic composition of solder metals: tin and lead) is deposited to cover a higher melting point solder feature. However, in practice, the capping step must be tightly controlled to form caps of sufficient volume over the solder features while avoiding the deposition of the capping material at undesired locations on the substrate. As will be understood, the effects of misalignment due to differential thermal expansion between the substrate and the mask or between the first deposited features and the mask must be better controlled.

"Knife edge" sidewalls, i.e. sidewalls having an edge which projects into the aperture opening, are formed in apertures of contact masks used for material deposition. The knife edge is a result of chemical etching from both sides of a contact mask to form apertures therein. Conventionally, a knife edge comes to a sharp edge about halfway up the height of the aperture sidewall. Such knife edge apertures are understood to have beneficial effects in maintaining a separation between the mask and deposited material, up to a height of deposited material of 125% of the mask thickness above the substrate. However, when the height of the deposited material is greater than 125% of the mask thickness, the deposited material can undesirably become detached from the substrate upon removal of the mask. This problem is further exacerbated when the mask is used to define second features over first raised features already deposited through the mask in a previous deposition step, as described in Applicants' co-pending U.S. patent application (Ser. No. 08/476,474). In such case, even slight misalignment of such conventional mask apertures to previously deposited features, whether thermal or mechanical in origin, can lead to the deposited features being gouged or detached from the substrate when the mask is removed, regardless of the height of the features relative to the mask thickness.

U.S. Pat. No. 5,359,928 to Blessington, deceased et al. ("the '928 Patent") describes a paste screen printing stencil having apertures which are larger on a bottom substrate facing surface than on a top paste receiving surface (FIG. 3, col. 2, lines 65–68). The '928 Patent notes that a knife edge in the sidewall of apertures can lead to deposited solder paste being pulled away or smeared upon removal of the stencil (col. 6, lines 31–55). The '928 Patent proposes a solution to such paste screening problem which is very different from Applicants' invention, as will be described in the following. The '928 Patent describes using electroforming instead of etching to form screen apertures to eliminate the knife edge in the sidewall and to provide aperture sidewalls that are tapered and smooth. The '928 Patent further describes forming raised edges 13 around the bottom aperture openings for use in sealing the screen stencil against leakage of the liquid paste around deposited features on the substrate.

As will be understood from the description of the invention to follow, the screen printing stencils described in the '928 Patent could not be used in the manner described herein for the invention in forming solder features by vapor deposition onto semiconductor wafers. Electroformed panels are known to have much less shear strength than etched panels of rolled or forged metal. For this reason, electroformed panels deflect and can break too easily for use in a vapor deposition process as described in the following. Secondly, the raised edges surrounding the mask apertures described in the '928 Patent can place stress in semiconductor wafer substrates, causing indentation of polymer films and potential cracking and breakage of inorganic dielectric films on such substrates. Thus, it will be understood that the teachings of the '928 Patent cannot be meaningfully applied to the problem solved by the invention in depositing materials onto a wafer substrate.

SUMMARY OF THE INVENTION

Accordingly, it is an object of the present invention to provide a mask for depositing features upon a substrate which is used to reduce the rate of undesired detaching or damaging of deposited features.

It is another object of the invention to provide a mask which provides improved compensation for thermal expansion related misalignment.

Still another object of the invention is to provide a mask by which larger volume cap structures are deposited over first features than has heretofore been practiced.

Still another object of the invention is to provide a mask used to form fused cap on solder structures having relatively large cap volumes.

These and other objects of the invention are provided by the mask of the present invention. Accordingly, the mask has a plurality of apertures therein, wherein each aperture has a lower opening in the bottom side of the mask contacting the substrate and a constricted opening located near the top side of the mask.

Preferably, a dimension of the lower opening of the mask is larger than a dimension of the constricted opening, more preferably between 10% and about 35% larger than the constricted opening, and most preferably about 25% larger than the constricted opening. Preferably, the sidewall of each aperture terminates in a knife edge at the constricted opening. It is also preferred that the apertures be located in the mask according to their respective radial positions at an elevated temperature.

DETAILED DESCRIPTION OF THE PREFERRED EMBODIMENTS

Figure 1:
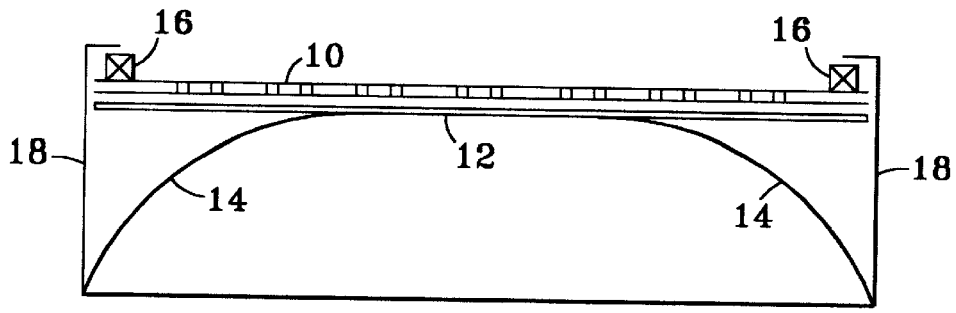
FIG. 1 shows the placement and use of the mask of the present invention in patterning material features on a wafer substrate.

FIG. 1 shows the placement and use of the mask of the present invention in patterning material features on a substrate such as a semiconductor wafer. As shown in FIG. 1, mask 10 is held in close contact with substrate 12 by the force of springs 14 against the back side of substrate 12, mask 10 being held in place by ring 16 in chuck 18. As evident from the arrangement shown in FIG. 1, mask 10 must be substantially rigid and not brittle, in order to avoid excessive deflection or cracking (and resultant loss of contact with substrate 12) due to the compressive force of springs 14.

Figure 2:
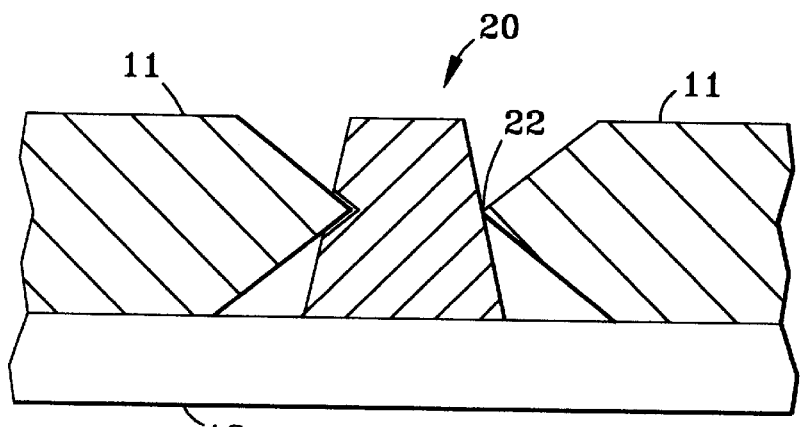
FIG. 2. illustrates the sidewall shape of an aperture in a mask having a conventional knife edge sidewall.

FIG. 2 is a diagram showing a cross-section of an aperture 20 within a conventional mask 11 used for depositing material, especially metal upon a substrate 12. As shown in FIG. 2, aperture 20 is provided with a knife edge 22 in the sidewall thereof about halfway up the height of the aperture thickness from the substrate. As used, knife edge 22 of aperture 20 in conventional mask 11 permits features of trapezoidal cross-section to be deposited, when the deposited features have height less than about 100% of the mask thickness above the substrate. However, when the deposited features have height greater than 100% of the mask thickness, an unacceptable proportion of features deposited through such masks have been observed to become damaged or detached from substrate 12 upon removal of mask 10. This problem has been traced to two primary causes: 1) the continuity that results between features of such height deposited through the mask apertures and the conformal film of metal which accumulates on the top surface of mask 12 during deposition; and 2) gouging of the deposited features 24 by knife edge 22 in the sidewall of mask 10 due to thermally related shifts in the relative positions of mask 10 and the deposited features. Gouging and loss of adhesion are observed in still greater proportions when alignment is less well controlled and materials are deposited layer upon layer in a multiple deposition process.

Figure 3:
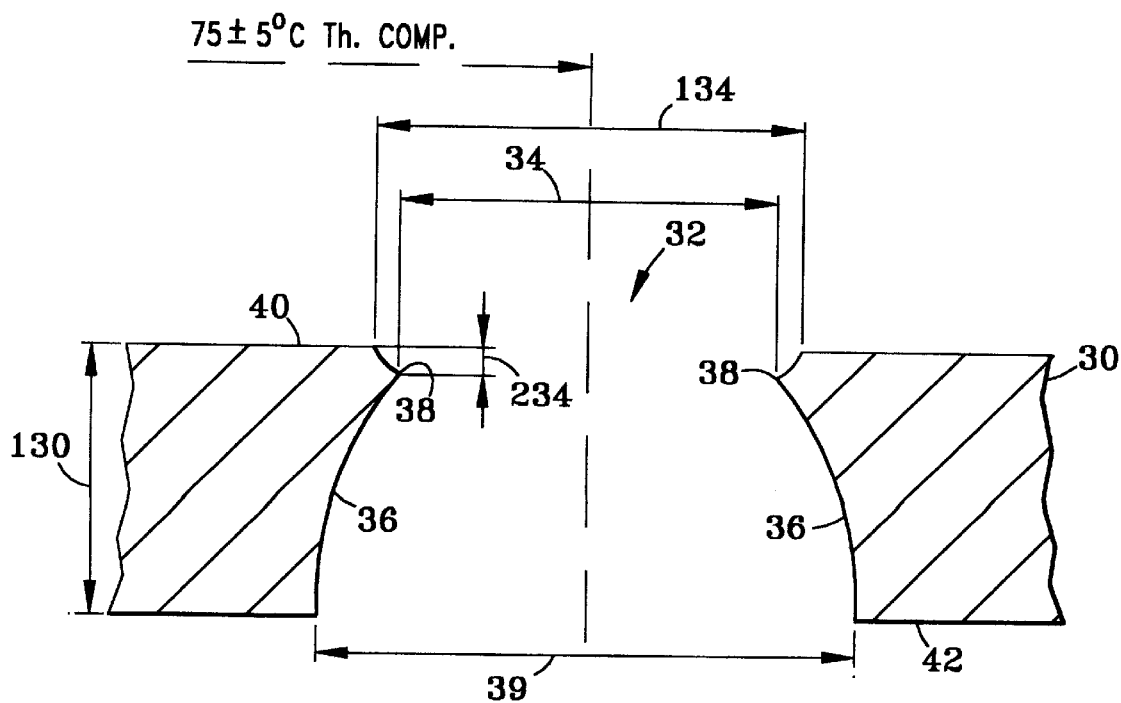
FIG. 3 illustrates the sidewall shape of an aperture in a mask constructed according to the present invention.
Figure 4:
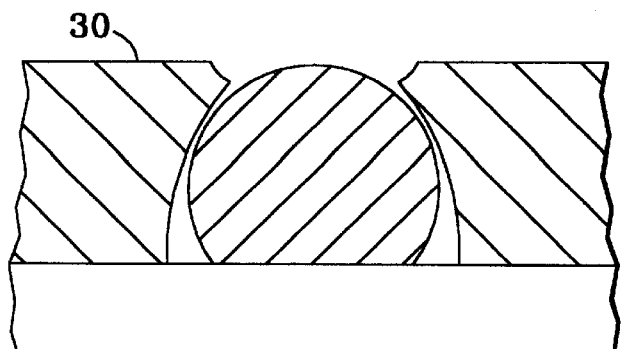
FIG. 4 illustrates the relationship between an aperture of the mask of the present invention and a material feature which is deposited therethrough.

FIG. 3 shows a cross-sectional view of an aperture 32 of a mask 30 constructed according to the present invention. As shown in FIG. 3, aperture 32 contains a constricted opening 34 in sidewall 36 thereof. The constricted opening 34 terminates in a knife edge 38 near the top 40 of the mask aperture (on the top side of mask 30, i.e., the side which is nearest the source of the deposition material).

As used herein, the term "knife edge" is meant a fine edge at the intersection of sidewall surfaces. However, it will be understood that the term "knife edge" also denotes such an edge which is dulled unintentionally or intentionally during manufacture or as a result of handling or use.

Preferably, the knife edge 38 is situated in the sidewall 36 within 30% of the mask thickness from the top surface of mask 30, and more preferably between 10% and 30% of the mask thickness down from the top surface 40 of mask 30.

Preferred dimensions of aperture 32 which have been found to work especially well in a deposition process of solder and solder with tin cap are as follows. For deposition of solder pads of diameter nominally 4.0 mil (±0.3 mil), a mask 30 of thickness 4.0±0.2 mil is selected and apertures are formed in mask 30 having diameter at knife edge 38 of 4.0±0.3 mil. Knife edge 38 is formed less than or about 1.2 mil below the top surface 40 of mask 30, resulting in an aperture which has a minimum diameter of 4.0±0.3 mil at the constricted opening 34, i.e. at knife edge 38, and a maximum diameter at the lower opening 39 in the bottom surface 42 of mask 30 of 5.8±0.3 mil.

While the foregoing relative and fixed dimensions are preferred, the single overriding constraint is that the lower aperture opening 39 in the bottom surface 42 of mask 30 be at least 10% larger than the constricted opening 34.

The locations of apertures in mask 30 are thermally compensated according to their predicted positions at the deposition process temperature. The positions, in turn, are predicted according to the relative coefficients of thermal expansion of mask 30 and substrate 12 and the distance of apertures with respect to one or more fixed reference points on the mask 30 or substrate 12.

A preferred method of fabricating mask 30 is as follows. A sheet of cold rolled molybdenum is covered on both top and bottom surfaces 40 and 42 with a photoresist material (not shown) and then patterned by photolithography to form opened areas in the resist over the apertures 32 to be formed. Opened areas of the resist pattern over mask 30 are then etched by processes which differ in etch rate for top and bottom surfaces 40, 42 to form apertures 32. One method for performing such differential etching is by pulsing an etchant composition from a spray nozzle towards the top and bottom surfaces of mask 30 at different rates, such that the time of contact of etchant to the bottom surface 42 is greater than the time of contact to the top surface 40, preferably by a factor of four. Preferably, etching of apertures 32 is conducted from both top and bottom surfaces 40, 42 simultaneously in order to reduce fabrication time, although this is not a requirement for producing apertures of the required cross-section.

Alternatively, instead of varying the rate of pulsation in etchant towards top and bottom surfaces 40, 42 of mask 30, the volume of etchant provided in each pulse to top and bottom surfaces 40, 42 can be varied such that proportionately less etchant is provided to top surface 40 than bottom surface 42. In still another alternative method, the volume of etchant and rate of pulsation for top and bottom surfaces 40, 42 can be held constant, while the concentration of active reagents provided to each surface 40, 42 is varied. Preferably, in this alternative method, the etching of top and bottom surfaces 40, 42 would be performed at different times in order to best control the etching of each surface of mask 30.

Mask 30 is utilized in deposition processes as follows. In a one step deposition process for depositing single features, for example, simple solder bumps, mask 30 is thermally compensated to 75±5 degrees C. As will be understood, the difference in the coefficients of thermal expansion between the metal mask 30 and the substrate 12 of semiconductor material cause the positions of apertures 32 to shift with temperature relative to substrate 12. The thermal compensation of mask 30 to a nominal deposition temperature of 75 deg. C. allows for shifts in the position of each aperture 32 relative to the desired site of deposition when the substrate reaches the deposition temperature.

Figure 5:
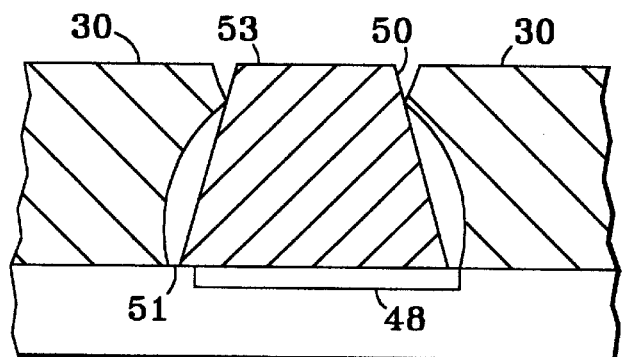
FIG. 5 illustrates a structure formed in a deposition process in which a first feature is deposited.
Figure 6:
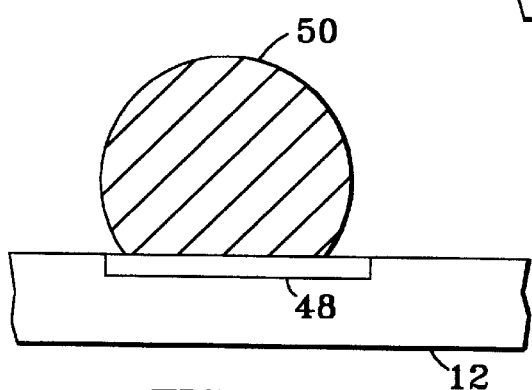
FIG. 6 illustrates a structure formed in a deposition process in which a first deposited feature is reflowed.

FIGS. 5–6 show the relationship of mask 30 to the feature 50 as deposited (FIG.5) and after reflowing (FIG. 6). As will be understood, the geometry of the aperture 32 in mask 30 provides a greater spacing between the knife edge 38 and the deposited feature 50, as compared to the spacing provided by a conventional mask in which the knife edge is situated near the midpoint of the mask thickness (FIG. 2). This greater spacing in mask 30 permits the knife edge 38 to shift a relatively great amount relative to the feature 50, thereby permitting mask 30 to be used for deposition of solder bumps on wafers having diameters up to 300 mm. (12 in.).

The inventors have found the mask 30 of the present invention to be especially advantageous in a process of depositing "bump on bump" features over BLM (ball limiting metallurgy) pads. With reference to FIGS. 5 through 8, in one such exemplary process, a BLM pad 48 is formed by vapor deposition of Cr, Au, Cu, Ni or any combination thereof through a mask 30 onto substrate 12. For such BLM deposition, mask 30 is thermally compensated to 225±5 deg. C. The substrate reaches that nominal temperature during deposition of BLM pads which precedes the deposition of solder bumps.

Without removing the 225 deg. C. compensated mask 30, first solder bumps of HMP composition are deposited at a deposition temperature of about 60 deg. C. The resulting structure of the deposited first solder bump 50 over the BLM pad 48 is shown in FIG. 5. Here, the displacement of the trapezoidal solder bumps 50 relative to the BLM pads 48 is not a concern because surface tension of the solder bump when molten during a subsequent reflow operation brings the solder bump into alignment with the BLM pad 48.

Figure 7:
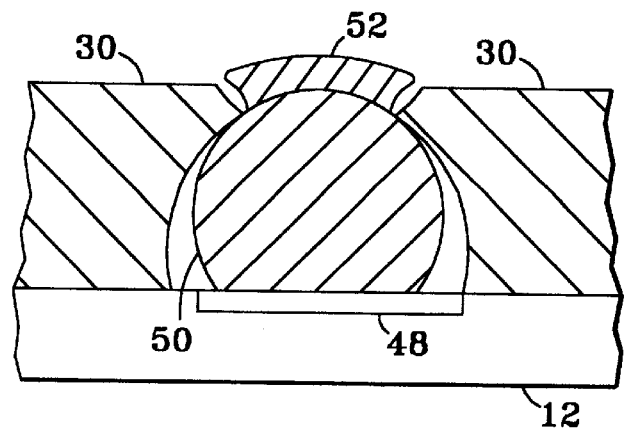
FIG. 7 illustrates a structure formed in a deposition process in which a second feature is deposited over a reflowed first deposited feature.
Figure 8:
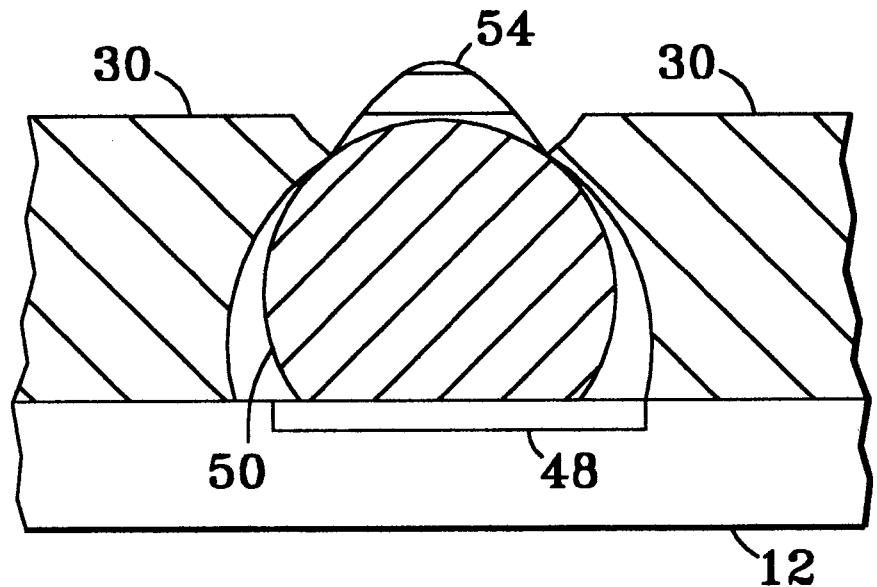
FIG. 8 illustrates a capped structure formed in a deposition process in which a second feature deposited over a first feature is reflowed.

Mask 30 is then removed and solder bumps 50 are reflowed by heating, which then results in the structure shown in FIG. 6. A second vapor deposition step is then performed in which caps of tin or of an eutectic composition 52 are vapor deposited over first solder bumps 50 through apertures 32 of a second mask 30, thermally compensated to 75 deg. C., resulting in a structure as shown in FIG. 7. Mask 30 is then removed to expose solder "bump" features 50 having caps 52. After an optional reflowing step (FIG. 8), mask 30 is removed to expose reflowed tin caps 54 which adhere to the top surface of the solder bumps. The unique geometry of the apertures 32 within mask 30 improves control over the formation of the caps 52, or 54.

Figure 9:
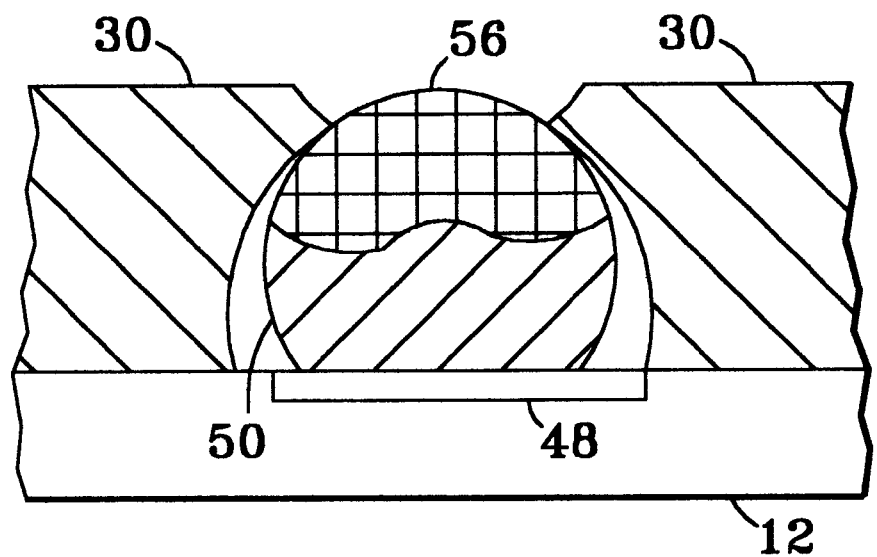
FIG. 9 illustrates a fused structure formed in a deposition process in which a second feature deposited over a first feature is fused into the first deposited feature.

With reference to FIG. 9, when the cap is of an eutectic composition, the reflowing step results in a fusion of the eutectic cap 52 with the underlying solder bump 50. Such fusion provides strong mechanical adhesion of the fused eutectic cap 52 to the underlying solder bump 50 which lowers the incidence of undesired detaching of caps from solder bumps during transporting, chip attach processing and electrical testing, as caused by shock, vibration and friction.

The placement of knife edge 22 near the top of mask aperture sidewalls 30 results in several important benefits. In cases where it is desired to prevent the interaction of the deposited cap 52 with structures underlying the solder bumps, e.g. BLMs, because of possible reactions between BLM metals (usually of Au, Cu or Ni composition) and tin, knife edge 38 placed in the upper sidewall of aperture 32 inhibits the flow of liquid tin, or the liquid eutectic composition, downward along the surface of solder bump 50. An equally important benefit of the placement of knife edge 38 in the upper sidewall is realized in that a greater quantity of tin 52 can be deposited on the surface of solder bump 50 than is possible with existing contact masks (FIG. 2), thereby resulting in larger tin cap structures 52. In addition to the foregoing, as described above in reference to single feature or "bump" deposition, the placement of knife edge 38 near the top of apertures 32, and the conical shape of apertures 32, which grow larger with increasing proximity to the surface of substrate 12, result in a lowered incidence of undesired gouging or detaching of features when mask 30 is removed from substrate 12.

Utilization of the instant process results in larger volumes for each LMP cap or eutectic cap. This, in turn, permits larger chips (ICs) to be joined to packaging substrates, because the larger LMP or eutectic composition volume provides larger collapsibility and compensates for expected greater variations in the planarity of semiconductor chip or packaging substrates.

While the invention has been described with reference to certain preferred embodiments thereof, those skilled in the art will understand the many modifications and enhancements that can be made without departing from the true scope and spirit of the invention as set forth in the claims appended below.

What is claimed is:

1. A mask having apertures for controlling the deposition of features upon a substrate, said mask comprising:
   a panel; and
   a plurality of apertures in said panel, each said aperture having a lower opening in a bottom side of said panel contacting said substrate and a constricted opening in a sidewall of said aperture near a top side of said panel, wherein a dimension of said constricted opening is smaller than a dimension of said lower opening.

2. The mask of claim 1 wherein said lower opening dimension is at least 10% larger than said constricted opening dimension.

3. The mask of claim 1 wherein said lower opening dimension is about 25% larger than said constricted opening dimension.

4. The mask of claim 3 wherein said sidewall of said aperture terminates in a knife edge at said constricted opening.

5. The mask of claim 4 wherein said constricted opening is located within 25% of a thickness of said panel from said top side.

6. The mask of claim 1 wherein said apertures are formed in said panel according to their respective radial positions at an elevated temperature.

7. A mask having apertures for controlling the deposition of features upon a substrate, said mask comprising:

a panel; and a plurality of apertures in said panel, each said aperture having a lower opening in a bottom side of said mask contacting said substrate and a constricted opening terminating in a knife edge in a sidewall of said aperture near a top side of said panel, wherein a dimension of said lower opening is about 25% larger than a dimension of said constricted opening, said knife edge being located within 25% of a thickness of said panel from said top side.

8. The mask of claim 7 wherein said apertures are formed in said panel according to their respective radial positions at an elevated temperature.

9. A method of fabricating a material deposition mask, comprising the steps of:

photolithographically defining openings in photoresist layers formed on top and bottom sides of a mask panel; and differentially etching said mask panel through said openings with respect to said top side and said bottom side to form a mask having apertures, said apertures having lower openings in said bottom side which are larger than constricted openings located near said top side of said mask.

10. The method according to claim 9 wherein said differential etching is performed by simultaneously etching from said top side and from said bottom side, and said etching from said top side is performed at a decreased rate relative to said etching performed from said bottom side.

11. The method according to claim 10 wherein said etching from said top side is performed at a rate which is between 10% and 80% of said rate of etching performed from said bottom side.

12. The method according to claim 10 wherein said etching from said top side is performed with an etchant having a decreased reagent concentration relative to an etchant used to perform said etching from said bottom side.

13. The method according to claim 9 wherein said differential etching is performed by applying an etchant to said top side and said bottom side at different rates.

14. The method according to claim 13 wherein said etchant is applied by pulsing a spray nozzle at different rates towards said top side and said bottom side, respectively.

* * * * *